United States Patent [19]

Chino et al.

[11] 4,414,605
[45] Nov. 8, 1983

[54] POSITIVE LOCKING MECHANISM

[75] Inventors: John J. Chino, Arnold; Paul LePage, Towson; Robert M. Rossi, Glen Burnie; Herman Rossman, Randallstown, all of Md.

[73] Assignee: The United States of America as represented by the Secretary of the Navy, Washington, D.C.

[21] Appl. No.: 278,820

[22] Filed: Jun. 29, 1981

[51] Int. Cl.³ .............................................. H05K 7/20
[52] U.S. Cl. .................................. 361/388; 361/385; 361/386; 361/415
[58] Field of Search ............... 361/386, 388, 389, 415, 361/383–385; 211/41; 174/16 HS; 165/80 R, 80 A, 80 B, 80 D, 122, 104, 33, 185; 339/17 R, 17 L, 17 LC, 17 LM, 17 M, 75 MP

[56] References Cited

U.S. PATENT DOCUMENTS

| | | | |
|---|---|---|---|
| 2,187,011 | 1/1940 | Braden | 361/384 |
| 3,061,761 | 10/1962 | Blain | 317/101 |
| 3,243,660 | 3/1966 | Yuska | 165/184 |
| 3,467,891 | 9/1969 | Mogle | 317/101 |
| 3,474,387 | 10/1969 | Krum et al. | 339/75 |
| 3,484,129 | 12/1969 | Askren | 29/764 |
| 3,678,342 | 7/1972 | Shaw | 317/100 |
| 3,683,317 | 8/1972 | Walkup | 339/75 |
| 3,735,206 | 5/1973 | Pesek | 317/100 |
| 3,942,586 | 3/1976 | Fries | 361/385 |
| 4,120,021 | 10/1978 | Roush | 361/385 |
| 4,157,583 | 6/1979 | Basmajian et al. | 361/388 |
| 4,298,903 | 11/1981 | Ellis | 361/386 |
| 4,298,905 | 11/1981 | Bosler et al. | 361/386 |
| 4,318,157 | 3/1982 | Rank et al. | 361/386 |

FOREIGN PATENT DOCUMENTS 797096  11/1979  U.S.S.R. ............................ 361/386

*Primary Examiner*—G. P. Tolin
*Attorney, Agent, or Firm*—Paul S. Collignon; Richard S. Sciascia

[57] ABSTRACT

A positive locking mechanism is provided for securing a plug-in electronic module in a chassis. A threaded element is provided for attaching the electronic module to the chassis and tightening of the threaded element forces a module connector into engagement with a mating connector in the chassis. A pivotal driver blade is provided for turning the threaded element and, after the connectors are mated, the driver blade is pivoted and a cam thereon actuates wedges which provide a good thermal interface between the electronic module and the chassis. The driver blade also serves as means for extracting the plug-in electronic module from the chassis.

3 Claims, 4 Drawing Figures

POSITIVE LOCKING MECHANISM

BACKGROUND OF THE INVENTION

The present invention relates to an improved locking mechanism for plug-in electronic modules which are slidably mounted in grooves or ways in a chassis.

There is a constant demand for smaller electrical and electronic components, particularly in the aircraft and missile fields, as weight is of extreme importance. One concept of microelectronics which has been recently developed and which offers a great reduction in size and weight of electronic units is that of integrated circuitry which is formed on insulated bases such as glass, fused silica, or ceramic substrates. Integrated circuitry includes a number of active and passive components which are fabricated by one or more of a combination of several thin film deposition techniques onto a glass or ceramic substrate.

In order to reduce costs, expedite production, and provide a reliable electronic component, electronic plug-in modules have been developed which are capable of meeting various system requirements. One such plug-in module is shown in U.S. Pat. No. 3,243,660, entitled "Electronic Module Assembly", which issued Mar. 29, 1966, to Leonard J. Yuska and David P. Zimmerman. One concept of a standard hardware program is to have a plurality of modules which plug in a chassis to form an assembly and normally these plug-in modules slide in grooves or ways in the chassis and engage a mating female connector. These modules are closely assembled and dissipate a lot of heat which, if not removed, greatly affects component reliability.

Various attempts have been made to cool electronic assemblies and generally employ some type of cooling coil and fan assembly. One such device is shown in U.S. Pat. No. 2,187,011, entitled, "Cooling Means For An Electrical Apparatus", which issued Jan. 16, 1940, to Paul F. Braden. In one embodiment of this patent, a fan blows air over a cooling oil and the air passes successively through three shelves which support vacuum tubes and other electrical components. The disadvantage of such an arrangement, however, is that the first shelf receives cool air, which is heated by the electrical components, and the last shelf receives hot air and experiences little or no cooling effect.

In U.S. Pat. No. 3,942,586, entitled, "Cooling Arrangement For Flat Semiconductor Components", which issued Mar. 9, 1976, to Paul Fries, the inventor recognized a need for cooling all the mounted components. He stated that there is a need for an improved cooling arrangement for stacked flat semiconductors which can: (1) take advantage of the benefits of the heat pipe; and (2) in addition, provide adequate cooling to the semiconductors no matter what their location is within the column or stack. That is, the problem is to provide an arrangement in which cooling air of essentially the same temperature can flow over all the heat pipes in such an arrangement. The solution proposed was to axially align the semiconductor components with the axes of the heat pipes of the cooling elements which are located one over the other, arranged so that they are rotationally displaced with respect to each other about the stack axis.

In U.S. Pat. No. 4,120,021, entitled, "Cooling System For Electronic Assembly", which issued Oct. 10, 1978, to Maurice Roush, there is described a system which provides a more efficient and higher capacity heat transfer from the circuit modules to the refrigeration system. There is provided a plurality of cooling bars associated with the chassis of the electronic apparatus and the cooling bars have a plurality of slots formed therein. The cooling bars are positioned adjacent one another and spaced apart a distance according to the width of the circuit modules. The circuit modules are provided with heat conducting flanges along the sides thereof which are adapted for fitting into the slots of adjacent cooling bars in heat conducting relation therewith. Clamping means are provided to clamp the flanges into tighter heat conducting contact with the slots. In a preferred embodiment, the clamping means comprises a plurality of camming surfaces attached to the face of the cooling bar adjacent the slots, and wedge blocks having second camming surfaces slidably positioned on the first camming surfaces adjacent the slots. Means are provided for moving the wedge blocks along the camming surfaces thereby forcing the wedge blocks against the heat conducting flanges and the flanges against the sides of the slots for maximum heat conducting contact.

Many plug-in modules of modern design now have wedge mechanisms at each end which are used to provide a good thermal interface between a module and the chassis. These units, however, generally require two separate tools for assisting in the insertion and removal of the plug-in module. One tool is of a wrench or screw driver type which supplies a mechanical advantage in operating the wedging mechanism. Another tool is of the type shown in U.S. Pat. No. 3,484,129, entitled, "Universal Extractor Tool", which issued Dec. 16, 1969, to Sherman G. Askren. This patent relates to an extractor tool for removing plug-in modules with a controlled force.

One disadvantage of using a separate tool for supplying a mechanical advantage in operating wedging mechanism is that there is no indicator or visual means to determine if the wedges have been moved to their desired position. Also, loose tools can be readily lost and frequently are not available when needed.

SUMMARY OF THE INVENTION

The present invention relates to a locking mechanism for securing plug-in electronic modules to a chassis. A locking mechanism is provided on each end of a plug-in electronic module and serves to both physically attach the module to the chassis and to operate a wedge mechanism which provides a good thermal interface between the module and the chassis.

Each locking mechanism is comprised of a threaded element which engages a tapped hole in the chassis. A pivotal driver blade is provided for turning the threaded element, and, after the threaded element is fully engaged in the tapped hole, the driver blade is pivoted and a cam thereon actuates wedges which engage the electronic module and the chassis to provide a good thermal interface. The drive blade also serves as a means for extracting the plug-in electronic module from the chassis when the module is removed.

It is therefore a general object of the present invention to provide an improved locking mechanism for a plug-in electronic module.

Another object of the present invention is to provide a locking mechanism for a plug-in module which can be used to remove the module from the chassis.

DESCRIPTION OF THE PREFERRED EMBODIMENT

Figure 1:
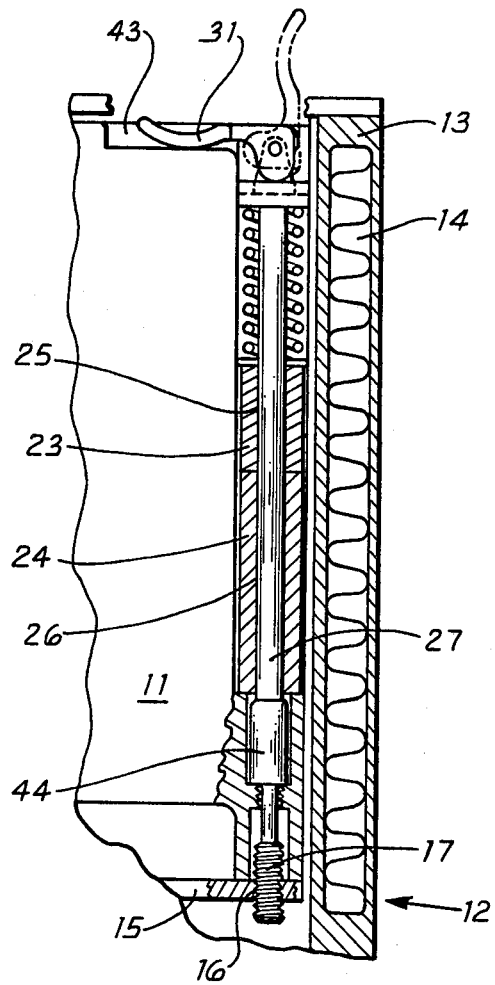
FIG. 1 is a partial end view, partly broken away, showing a preferred embodiment of the invention.

Referring now to the drawing, there is shown an electronic plug-in module 11 that is mounted in a chassis 12. The wall 13 of the chassis is shown having a passage arrangement 14 through which either cooling water or air can pass in order to remove heat from chassis 12 which is transferred from a plurality of modules 11. By way of example, one type of plug-in module is shown in U.S. Pat. No. 3,243,660, entitled "Electronic Module Assembly", which issued Mar. 29, 1966, to Leonard J. Yuska and David P. Zimmerman. Also, the above-referenced patent to Sherman G. Askern, shows an arrangement of plug-in modules in a chassis.

Figure 2:
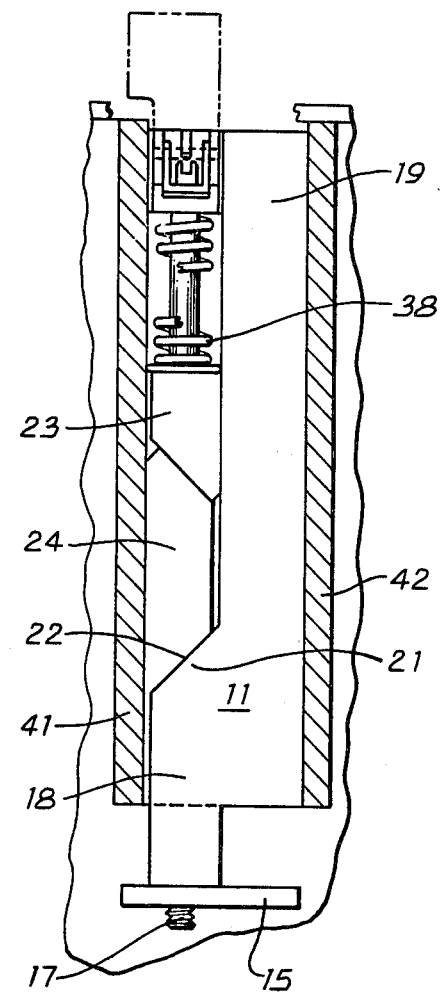
FIG. 2 is a partial side view of the preferred embodiment.

A female connector is provided for each module 11 and these female connectors are attached to a base plate 15. Base plate 15 has a pair of threaded holes 16 provided for each module 11, and a threaded element 17 is provided at each end of module 11 so that module 11 can be secured to base plate 15. As best shown in FIG. 2 of the drawing, module 11 has a wide portion 18 at its bottom end and a more narrow portion 19 at its upper end. A tapered portion 21 joins the wide and narrow portions and thus provides a wedge surface 22. A pair of wedges 23 and 24 are provided above wedge surface 22 and wedges 23 and 24 have clearance hole or slot 25 and 26, respectively, therein so that an unthreaded portion 27 of threaded element 17 is positioned within wedges 23 and 24. Threaded element 17 is provided with a head 28 which is provided with a screwdriver slot 29.

Figure 3:
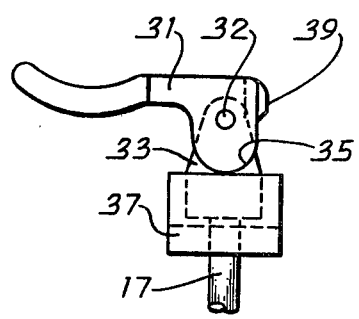
FIG. 3 is a side view of pivotal driver blade mechanism.
Figure 4:
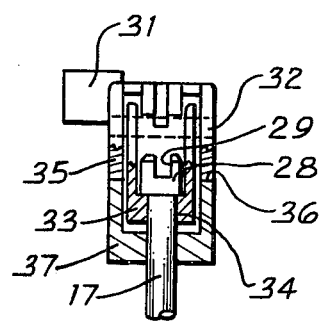
FIG. 4 is an end view, partly in section, of the driver blade mechanism shown in FIG. 3.

Referring now to FIGS. 3 and 4 of the drawings, a lever 31 is pivotally supported on shaft 32 which is attached to a U-shaped bracket 33. Bracket 33 has a hole 34 through which threaded element 17 is passed so that bracket 33 is supported about threaded element 17. Lever 31 is provided with a pair of cam surfaces 35 and 36 which are engageable with a U-shaped spring compressor 37. A spring 38 is positioned between spring compressor 37 and the top of wedge 23. Lever 31 is also provided with a driver blade 39 which is engageable with slot 29 in threaded element 17.

OPERATION

In operation, a plug-in module 11 is guided between rails 41 and 42 and the male connector on module 11 is partially engaged with a female connector on base plate 15. Lever 31 is then rotated and pivoted so that driver blade 39 engages slot 29 in head 28 of threaded element 17. Turning of lever 31 causes threaded element 17 to be threaded with hole 16 and as there is a threaded element 17 at each end of module 11, the male connector on module 11 will be slowly engaged with the female connector on base plate 15. The amount of travel of threaded element 17 is limited by the enlarged diameter portion 44. When threaded element 17 has been fully engaged in hole 16, lever 31 is pivoted about shaft 32 and lever 31 is positioned in clearance slot 43. Rotation of lever 31 about shaft 32 causes cam surfaces 35 and 36 to depress spring compressor 37 and thereby compress spring 38. Spring 38 thus applies a biasing force against wedge 23 which, in turn moves wedge 24 into contact with rail 41 and facilitates heat transfer from module 11 to chassis 12. The position of lever 31 serves as an indicator that wedge 24 is in contact with rail 41 thereby facilitating heat transfer from module 11 to chassis 12. When lever 31 is pivoted downwardly into clearance slot 43, wedge 24 is biased against rail 41, and when lever 31 is in an upright position, no biasing force is applied by spring 38 against wedges 23 and 24. Thus it can be seen that the position of lever 31 readily indicates the position of wedges 23 and 24.

When it is desired to remove module 11 from chassis 12, a reverse order of the above-described steps is performed. Lever 31 is first pivoted to an upright position and rotation of cam surfaces 35 and 36 permits spring 38 to expand thus removing the biasing force from wedges 23 and 24. Driver blade 39 is again engaged in slot 29 of head 28 and lever 31 is turned in order to disengage threaded element 17 from hole 16. When element 17 is disengaged, lever 31 is used as a handle or grip to remove module 11 from chassis 12.

It can thus be seen that the present invention provides an improved locking mechanism for attaching a plug-in electronic module to a chassis and for assuring good heat transfer from the module to the chassis.

Obviously many modifications and variations of the present invention are possible in the light of the above teachings. It is therefore to be understood that the invention may be practiced otherwise than as specifically described.

We claim:

1. An apparatus comprising a mechanism locking an electronic plug-in module to a chassis and providing good thermal interface between said module and said chassis, said mechanism comprising:
    a shaft having a threaded section on one end engaging a threaded hole in a chassis and having a slotted head on the opposite end,
    wedging means slidably supported on said shaft and exerting a clamping force between said module and said chassis,
    spring means positioned between said slotted head and said wedging means,
    a lever pivotally attached to said shaft and having a blade thereon engageable with said slotted head,
    cams on said lever for compressively biasing said spring means and said wedging means whereby said wedging means provides good thermal interface between said module and said chassis, and
    said spring means comprising a helical spring and a spring compressor positioned between one end of said helical spring and said cams.

2. A mechanism as defined in claim 1, and further comprising:
    a U-shaped bracket rotatably supported beneath said slotted head, and a pivot pin extending through said bracket and said lever.

3. A mechanism as defined in claim 2, and wherein:
    said spring compressor comprises laterally spaced side portions operatively engageable by said cams, and
    said U-shaped bracked is disposed between said side portions of said spring compressor.

* * * * *